United States Patent [19]

Murakoshi et al.

[11] Patent Number: 4,751,384
[45] Date of Patent: Jun. 14, 1988

[54] ELECTRON BEAM METROLOGY SYSTEM

[75] Inventors: Hisaya Murakoshi, Hachioji; Mikio Ichihashi, Kodaira; Hideo Todokoro, Tokyo, all of Japan

[73] Assignee: Hitachi, Ltd., Tokyo, Japan

[21] Appl. No.: 13,534

[22] Filed: Feb. 11, 1987

[30] Foreign Application Priority Data

Feb. 17, 1986 [JP] Japan .................................. 61-30817

[51] Int. Cl.⁴ ......................... G01N 23/00; H01D 3/14
[52] U.S. Cl. ...................................... 250/310; 250/397
[58] Field of Search .............................. 250/310, 397; 313/361.1

[56] References Cited

U.S. PATENT DOCUMENTS

| 3,597,607 | 8/1971 | Campbell | 250/310 |
| 4,588,890 | 5/1986 | Fimmes | 250/310 |
| 4,600,839 | 7/1986 | Ichihashi et al. | 250/397 |
| 4,670,652 | 6/1987 | Ichihashi et al. | 250/310 |

FOREIGN PATENT DOCUMENTS 0165357 9/1984 Japan .................................. 250/310

Primary Examiner—Bruce C. Anderson
Attorney, Agent, or Firm—Antonelli, Terry & Wands

[57] ABSTRACT

An electron beam metrology system for measuring the width of a pattern on a surface of a sample in such a manner that the surface of the sample is scanned with an electron beam, secondary electrons emitted from the surface are detected to obtain a detection signal, and the width of the pattern is measured by using the detection signal, is disclosed in which a pair of detectors are disposed symmetrically with respect to the optical axis of the electron beam in a scanning direction thereof, a ratio of one of the output signals of the detectors to the other output signal and a ratio of the other output signal to the one output signal are formed, and a sum signal indicative of the sum of two ratios is produced, to be used for measuring the width of the pattern correctly and accurately, without being affected by a change in pattern material.

1 Claim, 2 Drawing Sheets

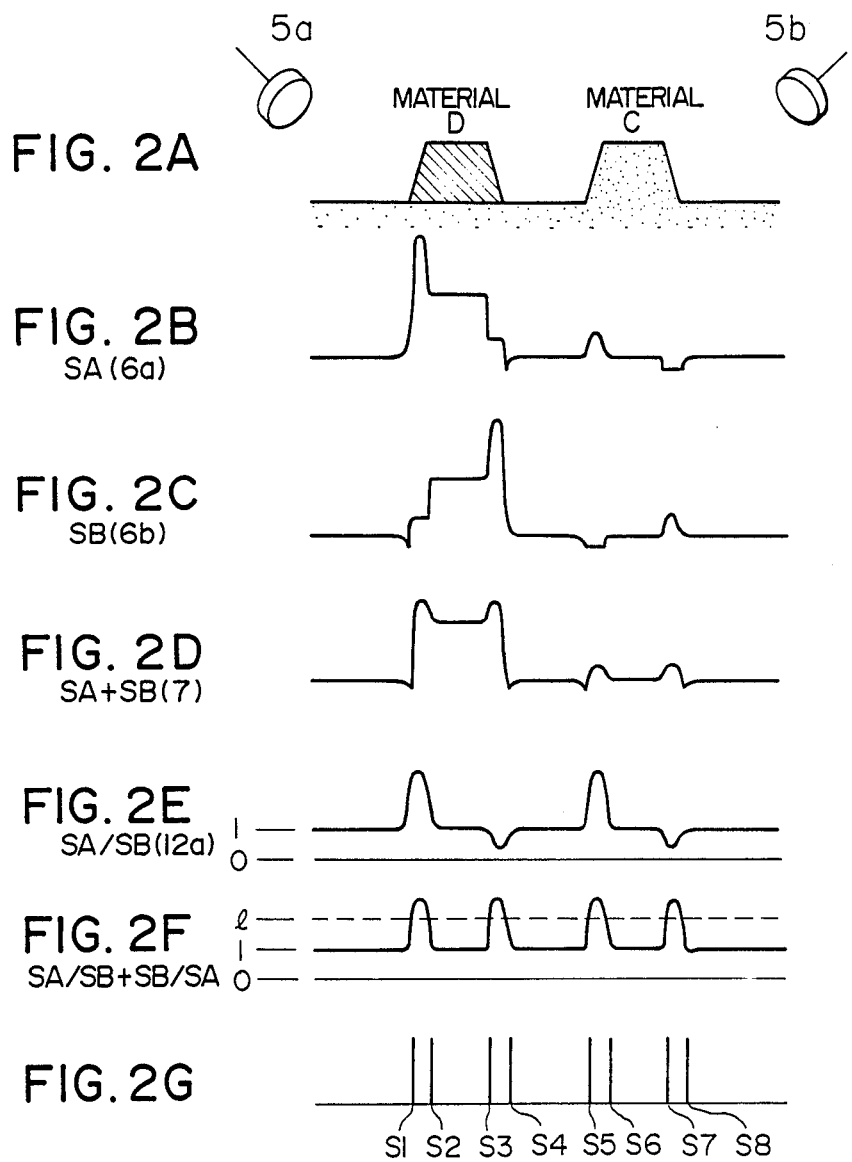

ELECTRON BEAM METROLOGY SYSTEM

BACKGROUND OF THE INVENTION

The present invention relates to an electron beam metrology system for measuring pattern width on a sample by scanning a surface of the sample with an electron beam, and more particularly to an electron beam metrology or metric system for measuring pattern width on a sample by using a detection signal which is obtained from a surface of a sample and has a signal level dependent on the presence or absence of pattern.

Recently, a method of measuring pattern width on a sample has been developed in which secondary electrons or others generated by scanning a surface of the sample with an electron beam are detected to obtain a video signal, and the width of a pattern formed on the surface is measured by using this video signal. The signal level of the video signal, however, is changed not only by the appearance of pattern, but also by a change in pattern material. Accordingly, there is a fear of measuring the width of the pattern erroneously. A method for detecting only a change in signal level due to the appearance of pattern is disclosed in Japanese patent application (JP-A-59-165357). In this method, a pair of detectors are disposed symmetrically with respect to the optical axis of an electron beam, and a ratio of the output signal of one of the detectors to the output signal of the other detector is used for the measurement of pattern width.

In the above method, however, no attention is paid to the difference between the above ratio at one of a pair of pattern edges and the ratio at the other pattern edge. That is, there arises a problem that the above ratio increases when the electron beam impinges on that side face of the pattern which confronts one of the detectors, and decreases in a marked degree when the electron beam impinges upon that side face of the pattern which confronts the other detector.

SUMMARY OF THE INVENTION

It is an object of the present invention to provide an electron beam metrology system which can generate a video signal corresponding to a surface of a sample and having a signal level dependent only on the presence or absence of pattern, to use the video signal for the accurate measurement of pattern width.

In order to attain the above object, an electron beam metrology system according to the present invention comprises a pair of detectors disposed symmetrically with respect to the optical axis of an electron beam in a direction in which a sample is scanned with the electron beam, for detecting secondary electrons or other generated by scanning the sample with the electron beam, means for obtaining a first ratio signal indicative of a ratio of an output signal from one of the detectors to an output signal from the other detector and for obtaining a second ratio signal indicative of a ratio of the output signal from the other detector to the output signal from the one detector, and means for obtaining a sum signal indicative of the sum of the first ratio signal and the second ratio signal.

The sum signal has the same signal level at one of a pair of side faces of a pattern formed on the sample and at the other side face, and thus has a well-balanced waveform. The width of the pattern can be measured correctly and accurately, by using the sum signal.

BRIEF DESCRIPTION OF THE DRAWINGS

FIG. 2A is a sectional view showing an example of a sample surface to be measured.

FIGS. 2B to 2G are waveform charts showing signal waveforms at various circuit parts of the embodiment of FIG. 1.

DESCRIPTION OF THE PREFERRED EMBODIMENT

Figure 1:
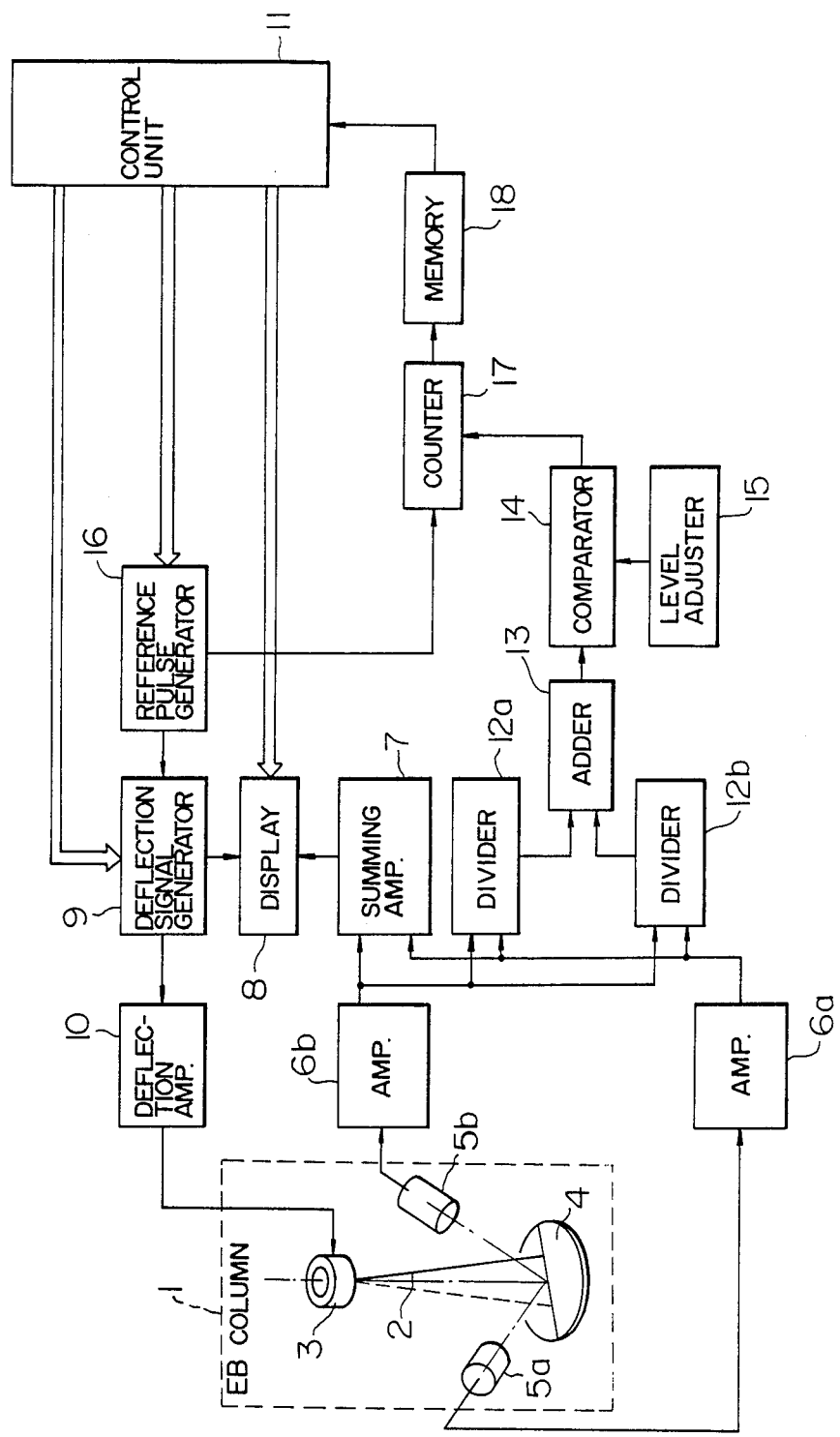
FIG. 1 is a block diagram showing an embodiment of an electron beam metrology system according to the present invention.

Now, explanation will be made of an embodiment of an electron beam metrology system according to the present invention, with reference to FIGS. 1 and 2A to 2G.

Referring to FIG. 1 which shows the construction of the above embodiment, a scanning operation for a sample is performed in an electron beam column 1. That is, a fine electron beam 2 is deflected by a deflector 3 so that a surface of a sample 4 is scanned one-dimensionally or two-dimensionally with the electron beam 2. Secondary electrons or others emitted from the surface of the sample 4 are detected by a pair of detectors 5a and 5b which are disposed symmetrically with respect to the optical axis of the electron beam 2, in a scanning direction thereof. Regarding such a pair of detectors, reference may be made to U.S. application, Ser. No. 911,791 filed on Sept. 26, 1986, which is hereby incorporated by reference. The output signals of the detectors 5a and 5b are amplified by amplifiers 6a and 6b, respectively. Although the construction for one-dimensional scanning is shown in FIG. 1 for the sake of brevity, another pair of detectors may be disposed in a direction perpendicular to the above scanning direction, to make possible to measurement of pattern width in this direction. Output signals from the amplifiers 6a and 6b are applied to a summing amplifier 7, the output of which is applied to a display unit 8, to be used as a brightness modulation signal. The scanning operation of the electron beam 2 is controlled by a deflection signal which is generated by a deflection signal generator 9 under the control of a control unit 11. The deflection signal is amplified by a deflection amplifier 10, and then applied to the deflector 3. That is, the deflection signal is synchronized with the scanning operation of the electron beam. The deflection signal is also applied to the display unit 8, to be used for forming the scanned image of the sample surface on the display screen of the display unit 8. The electron beam column 1 and the above circuit parts constitute a conventional scanning electron microscope.

Next, circuit parts of the present embodiment other than the above-mentioned parts and the measurement of pattern width by the present embodiment will be explained. In the following description, a case where the sample 4 has a cross section shown in FIG. 2A and a pattern is made of materials C and D, will be explained, by way of example. Now, let us suppose that the material D has a greater yield in secondary electron emission than the material C. For example, material C is Si substrate and material D is Al. Video signals SA and SB which have been delivered from the detectors 5a and 5b in accordance with the scanning operation of the electron beam and have been amplified by the amplifiers 6a and 6b, have waveforms shown in FIGS. 2B and 2C. In this case, the scanning operation of the electron beam is performed in a direction from the detector 5a towards the detector 5b. In conventional electron beam metrology systems, the output signal of the summing amplifier 7 shown in FIG. 2D (that is, a sum signal indicative of the sum of the video signals SA and SB) or a signal which is delivered from a single detector disposed parallel to the to-be-measured pattern and is similar to the above sum signal, is used for the measurement of pattern width. In such detection signals from a pattern made of two or more materials, however, a change in signal level is caused by the presence or absence of pattern and a change in pattern material. Accordingly, it is difficult to measure the pattern width by using that part of the detection signal which exceeds a predetermined level. In the present embodiment, the video signals SA and SB from the amplifiers 6a and 6b are applied to a divider 12a, to obtain a ratio signal indicative of a ratio of the video signal SA to the video signal SB. FIG. 2E shows the above ratio signal. As shown in FIG. 2E, the ratio signal is independent of the pattern materials, and a change in signal level is caused only by the appearance and disappearance of pattern on a scanning line. However, the ratio signal has a high level when the electron beam impinges upon that side face of the pattern which confronts the detector 5a, and has an extremely low level when the electron beam impinges upon that side face of the pattern which confronts the detector 5b. In view of the above fact, the video signals SA and SB from the amplifiers 6a and 6b are also applied to another divider 12b so as to obtain another ratio signal indicative of a ratio of the video signal SB to the video signal SA, and the ratio signals from the dividers 12a and 12b are applied to an adder 13, to obtain a sum signal indicative of the sum of two ratio signals. FIG. 2F shows the sum signal. As shown in FIG. 2F, the sum signal has a well-balanced (rather symmetric) waveform, and a change in signal level is caused only by the appearance and disappearance of pattern on the scanning line. The sum signal is applied to a comparator 14, to be compared with a reference level which is supplied from a level adjuster 15. The reference level is indicated by a broken line in FIG. 2F. Thus, a pulse signal which contains pulses S1 to S8 as shown in FIG. 2G, is delivered from the comparator 14. A counter 17 counts up reference pulses generated by a reference pulse generator 16. The number of reference pulses counted by the counter 17 corresponds to a deflected state of the electron beam, that is, a position at which the sample surface is irradiated with the electron beam. The output signal of the comparator 14 is applied to the counter 17. Those counted values or reference pulses which correspond to pulses from the comparator 14, are successively supplied from the counter 17 to a memory 18, and then supplied to the control unit 11. When a user specifies a particular region (including S1 to S8 in FIG. 2G) corresponding to a pattern width to be measured with the aid of the control unit 11, the control unit finds the number of reference pulses generated between the pulses, and calculates the width of the pattern from the above numbers, while taking into consideration the deflection sensitivity of the electron beam, or others. Thus, the width of a pattern can be measured by the present embodiment.

In the present embodiment, the sum of the video signals SA and SB shown in FIG. 2D is applied to the display unit 8, to be used as the brightness modulation signal. Alternatively, the sum signal shown in FIG. 2F may be used as the above brightness modulation signal.

As has been explained in the foregoing, according to the present invention, a signal whose level is changed only by the appearance and disappearance of pattern on a scanning line and moreover has the same value for the appearance and disappearance of pattern, is produced from secondary electrons or others generated by scanning a sample surface with an electron beam. Thus, the width of a pattern formed on the sample surface can be accurately measured by using the above signal, without being affected by a change in pattern material.

We claim:

1. An electron beam metrology system for measuring the width of a pattern on a surface of a sample by scanning the surface of the sample with an electron beam, detecting secondary electrons or others emitted from the surface of the sample to obtain a detection signal, and measuring the width of the pattern by using the detection signal, said electron beam metrology system comprising:
   detection means including a pair of detectors for obtaining the detection signal, said detectors being disposed symmetrically with respect to the optical axis of the electron beam in a scanning direction of the electron beam;
   means for obtaining a first ratio signal indicative of a ratio of the output signal of one of the detectors to the output signal of the other detector, and for obtaining a second ratio signal indicative of a ratio of the output signal of the other detector to the output signal of the one detector; and
   means for obtaining a sum signal indicative of the sum of the first ratio signal and the second ratio signal.

* * * * *